(12) United States Patent
Toyoda et al.

(10) Patent No.: US 9,219,214 B2
(45) Date of Patent: Dec. 22, 2015

(54) THERMOELECTRIC CONVERSION ELEMENT AND PRODUCING METHOD THEREOF

(75) Inventors: Kaori Toyoda, Hyogo (JP); Takaaki Higashida, Osaka (JP); Yoshihisa Ohido, Osaka (JP); Takashi Kubo, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 315 days.

(21) Appl. No.: 13/978,221

(22) PCT Filed: Jan. 23, 2012

(86) PCT No.: PCT/JP2012/000376
§ 371 (c)(1),
(2), (4) Date: Jul. 3, 2013

(87) PCT Pub. No.: WO2012/114650
PCT Pub. Date: Aug. 30, 2012

(65) Prior Publication Data
US 2013/0284228 A1    Oct. 31, 2013

(30) Foreign Application Priority Data
Feb. 22, 2011  (JP) ................. 2011-035648

(51) Int. Cl.
*H01L 35/04* (2006.01)
*H01L 35/32* (2006.01)
(Continued)

(52) U.S. Cl.
CPC ............ *H01L 35/04* (2013.01); *H01L 35/16* (2013.01); *H01L 35/32* (2013.01); *H01L 35/34* (2013.01)

(58) Field of Classification Search
CPC .......... H01L 35/04; H01L 35/34; H01L 35/32
USPC ........................................... 136/225
See application file for complete search history.

(56) References Cited

U.S. PATENT DOCUMENTS 3,930,303 A    1/1976  Alais et al.
5,055,140 A   10/1991  Kumada et al.
(Continued)

FOREIGN PATENT DOCUMENTS

CN    101840989 A    9/2010
DE     10232376 A1 *  2/2004  .............. H01L 35/32
(Continued)

OTHER PUBLICATIONS

DE 10232376 A1, Machine Translation, Feb. 2004.*
(Continued)

*Primary Examiner* — Devina Pillay
(74) *Attorney, Agent, or Firm* — Wenderoth, Lind & Ponack, L.L.P.

(57) ABSTRACT

The invention provides a thermoelectric conversion element having a lot of pn junction pairs per unit area and having a thermoelectric material chip which is hardly broken, and a producing method thereof. In the thermoelectric conversion element of the invention, plural substrates in each of which a film-shaped thermoelectric material is formed in a surface thereof are disposed. As a result, because the number of pn junction pairs per unit area is increased, a high output can be obtained. Because the thermoelectric material is formed into the film shape, reliability degradation caused by a breakage of the thermoelectric material can be prevented, even in the thermoelectric material having many pn junction pairs per unit area, namely, a sectional area is small.

8 Claims, 9 Drawing Sheets

(51) Int. Cl.
 *H01L 35/16* (2006.01)
 *H01L 35/34* (2006.01)

(56) References Cited

U.S. PATENT DOCUMENTS

| | | | |
|---|---|---|---|
| 6,043,423 | A | 3/2000 | Satomura et al. |
| 6,274,803 | B1 | 8/2001 | Yoshioka et al. |
| 2005/0178424 | A1 | 8/2005 | Yotsuhashi et al. |
| 2008/0163916 | A1 | 7/2008 | Tsuneoka et al. |
| 2010/0116308 | A1 | 5/2010 | Hayashi et al. |

FOREIGN PATENT DOCUMENTS

| | | |
|---|---|---|
| JP | 50-141287 | 11/1975 |
| JP | 1-93182 | 4/1989 |
| JP | 8-222770 | 8/1996 |
| JP | 10-303471 | 11/1998 |
| JP | 11-274581 | 10/1999 |
| JP | 2001-119076 | 4/2001 |
| JP | 3592395 B | 9/2004 |
| JP | 2006-86510 | 3/2006 |
| JP | 3927784 B | 3/2007 |
| JP | 3958857 B | 5/2007 |
| JP | 2008-205181 | 9/2008 |
| JP | 2009-246296 | 10/2009 |
| JP | 2011-199091 | 10/2011 |
| WO | 2005/047560 | 5/2005 |

OTHER PUBLICATIONS

English translation of Search Report dated on Mar. 27, 2015 for the related Chinese Patent Application No. CN2012800044600.
Partial English Translation of "Some Considerations on Thermoelectric Cooling Device", Yoshihiko Ogawa et al., IEICE Transactions C-2 vol. J75-C-2 No. 8 pp. 416-424, Aug. 1992.
Partial English Translation of "Development and research of thermoelectric module on Bi—Te based thin film", Kitagawa Industries Co Ltd. and AIST, pp. 24-25, Aug. 2003.
International Search Report of PCT Application No. PCT/JP2012/000376 dated Jun. 27, 2012.

* cited by examiner

THERMOELECTRIC CONVERSION ELEMENT AND PRODUCING METHOD THEREOF

TECHNICAL FIELD

The present invention relates to a thermoelectric conversion element and a producing method thereof.

BACKGROUND ART

An element in which a Peltier effect or a Seebeck effect is utilized is used as a thermoelectric conversion element. The thermoelectric conversion element has a simple structure, and the thermoelectric conversion element is easily handled to be able to maintain a stable characteristic. Therefore, the thermoelectric conversion element attracts attention of a wide variety of applications. Particularly, because the thermoelectric conversion element can perform to cool a limited part and to control a temperature of the limited part near room temperature, accurately, as an electronic cooling element, researches are widely conducted toward applications of optoelectronics and a an isothermal treatment of a semiconductor laser.

Conventionally, as illustrated in FIG. 8, in configuration of the thermoelectric conversion element used in electronic cooling and thermic generation. Plural pn junction pairs are arrayed in series, the pn junction pair being configured so that p-type thermoelectric material 804 is in contact with n-type thermoelectric material 805 through junction electrode 806. In FIG. 8, the sign 803 designates a substrate, the sign 801 designates a current introduction terminal (positive electrode), the sign 802 designates a current introduction terminal (negative electrode), and the sign H designates an arrow that indicates a heat flow direction. The thermoelectric conversion element illustrated in FIG. 8 is configured such that, depending on a direction of a current passed through a junction portion, one end portion is heated while the other end portion is cooled.

A material that has a large performance index Z in a usage temperature range is used as the thermoelectric conversion element. The performance index Z is expressed by a Seebeck coefficient "a" that is of a unique constant of a substance, a specific resistance "r", and a thermal conductivity "K" ($Z=a^2/rK$). Usually, a $Bi_2Te_3$ system material is used in the thermoelectric conversion element, and a crystal of the $Bi_2Te_3$ based material has a significant cleavage property. Therefore, when the thermoelectric conversion element is subjected to processes such as slicing and dicing in order to obtain the thermoelectric conversion element from an ingot, a yield may be significantly degraded due to a crack and a chip.

The following method is attempted to solve the problem. The method is for producing a thermoelectric conversion module comprising the steps of: mixing, a material powder having a desired composition; heating and melting the material powder; solidifying the melted material powder to form a solid solution ingot of a thermoelectric semiconductor material having a rhombohedral structure (hexagonal structure); crushing the solid solution ingot to form solid solution powders; homogenizing particle diameters of the solid solution powders; pressurizing and sintering the solid solution powders whose particle diameters are homogenized; and, plastically deforming and flatting the powder sintered body under a hot condition to orient a crystal of the powder sintered body toward a crystal orientation in which an excellent performance index is obtained (a step of hot upset forging) (for example, see PTL 1).

A shape of each thermoelectric material chip used as the thermoelectric conversion element is a cuboid whose one side ranges from hundreds micrometers to several millimeters. Recently, in the thermoelectric conversion element that is used under near room temperature including a temperature difference of tens degrees, it is said that the thermoelectric conversion element having the size and thickness of tens to hundreds micrometers has high performance (for example, see NPL 1).

The number of pn junction pairs in one thermoelectric conversion element is up to hundreds, and density of the pn junction pair is up to tens pairs/$cm^2$. Increasing the number of pn junction pairs becomes a necessary factor in order to improve thermoelectric conversion performance and in order to extend applications of the thermoelectric conversion element. Particularly, in power generation in which a small temperature difference is utilized, a generated electromotive force is proportional to the number of pn junction pairs. Therefore, desirably the number of pn junction pairs that are connected in series in the thermoelectric conversion element is increased as many as possible in order to take out a high voltage from the thermoelectric conversion element.

In the case in which the thermoelectric conversion element is used as a cooling element or a temperature control element, a current passed through the thermoelectric conversion element is increased with decreasing number of series-connected thermoelectric material chips. Therefore, it is necessary to make wiring or a power supply larger. Accordingly, desirably the number of series-connected thermoelectric material chips is increased as many as possible.

FIGS. 9A to 9E illustrate a conventional method for producing the thermoelectric conversion element in which the number of thermoelectric material chips per unit area (chip density) is increased while the size of the thermoelectric material chip is reduced.

In a bump forming process (a), solder bumps 602 are formed in both surfaces of plate-like or rod-shaped p-type or n-type thermoelectric material wafer 601. In an electrode wiring process (b), electrode wiring 301 is formed in a surface of substrate 101. In connecting process (c), thermoelectric material wafer 601 in which solder bumps 602 are formed through the bump forming process (a) is disposed in the face of substrate 101. Then electrode wiring 301 on substrate 101 and thermoelectric material wafer 601 are connected by soldering. FIG. 9C illustrates the connecting of p-type or n-type thermoelectric material wafer 601 and electrode wiring 301 on substrate 101. For example, when FIG. 9C illustrates the connecting of p-type thermoelectric material wafer 601 and electrode wiring 301 on substrate 101, similarly n-type thermoelectric material wafer 601 and electrode wiring 301 on substrate 101 are also connected.

In a cutting and removing process (d), connected thermoelectric material wafer 601 is cut and removed as needed basis such that electrode wirings 301, to which different types of thermoelectric material chips should be connected, emerge. Through the cutting and removing process (d), substrate 101 is prepared. On the substrate 101, p-type thermoelectric material chip 603 is connected to predetermined electrode wiring 301, and electrode wiring 301, to which n-type thermoelectric material chip 603 should be connected, emerges on the surface of substrate 101. Similarly, substrate 101 is prepared. On substrate 101, n-type thermoelectric material chip 603 is connected to predetermined electrode wiring 301n, and an electrode, to which a p-type thermoelectric material chip should be connected, emerges on the surface of substrate 101.

In an assembling process (e), for two substrates 101, surfaces, to each of which thermoelectric material chip 603 is connected, face each other. Thermoelectric material chips 603 are aligned to predetermined positions where thermoelectric material chips 603 should be connected with electrode wirings 301. A tip end of thermoelectric material chip 603 of one of substrates 101 is connected to electrode wiring 301, which corresponds to the chip, on the other substrate 101. Therefore, the thermoelectric conversion element including the pn junction pair in which the metallic electrode is interposed therebetween is formed (see PTL 2).

However, because a wafer is cut and removed to prepare the thermoelectric material chip whose section is small in a surface which is parallel to the substrate of the thermoelectric material chip, the conventional configuration has a problem in that the chip is broken during the cutting and removing process and during use. Additionally, the thermoelectric material chip is prepared by cutting and removing the wafer, which results in another problem in that the yield of the thermoelectric material is degraded.

In addition to the above thermoelectric conversion element, there is well known a thermoelectric conversion element in which p-type thermoelectric conversion material layers and n-type thermoelectric conversion material layers are alternately stacked with an insulating layer such as the substrate interposed therebetween. A thermoelectric conversion element, in which the p-type thermoelectric conversion material layers and the n-type thermoelectric conversion material layers are electrically connected in series at ends of the layers, is well known as the stacked type thermoelectric conversion element (for example, see PTLs 3 to 9). A thermoelectric conversion element, in which the p-type thermoelectric conversion material layers and the n-type thermoelectric conversion material layers are electrically connected in series at end portions of the layers in a direct manner or by surface contact in which a conductive layer is interposed, is also well known as the stacked type thermoelectric conversion element (for example, see PTLs 10 to 12). A method for forming the $Bi_2Te_3$ based material on the insulating substrate such as polyimide by sputtering is well known as a method for forming the layer of the thermoelectric conversion material (for example, see PTLs 13 and 14 and NPL 2).

CITATION LIST

Patent Literature

[PTL 1]
Japanese Patent No. 3958857
[PTL 2]
Japanese Patent No. 3592395
[PTL 3]
Japanese Patent Application Laid-Open No. 8-222770
[PTL 4]
Japanese Patent Application Laid-Open No. 11-274581
[PTL 5]
Japanese Patent Application Laid-Open No. 2008-205181
[PTL 6]
Japanese Patent Application Laid-Open No. 50-141287
[PTL 7]
U.S. Pat. No. 3,930,303
[PTL 8]
International Publication No. 05/047560
[PTL 9]
U.S. Patent Application Publication No. 2005/0178424
[PTL 10]
Japanese Patent Application Laid-Open No. 1-93182
[PTL 11]
U.S. Pat. No. 5,055,140
[PTL 12]
U.S. Patent Application Publication No. 2010/0116308
[PTL 13]
Japanese Patent Application Laid-Open No. 2006-86510
[PTL 14]
Japanese Patent No. 3927784

Non Patent Literature

[NPL 1]
IEICE Transactions C Vol. J75-C2 No. 8 pp. 416-424
[NPL 2]
Mitsuyoshi Sakai et al., "Development and research of thermoelectric module on Be—Te based thin film", Proceedings of thermoelectric conversion symposium 2003 (thermoelectric conversion workshop), 2003, p. 24-25

SUMMARY OF INVENTION

Technical Problem

An object of the invention is to provide a thermoelectric conversion element, having many pn junction pairs per unit area and a thermoelectric material chip which is hardly broken, and a producing method thereof.

Solution to Problem

The following thermoelectric conversion element is provided in order to achieve the object.
(1) A thermoelectric conversion element comprising:
alternate layers of p-type thermoelectric material layers and n-type thermoelectric material layers;
a plurality of substrates disposed between adjacent layers of the p-type thermoelectric material layers and n-type thermoelectric material layers;
contact holes respectively provided in the plurality of substrates such that the contact holes appear alternately at opposite ends, in a direction perpendicular to a direction of arrangement of the p-type thermoelectric material layers and the n-type thermoelectric material layers, of the substrates; and
a conductive material disposed in the contact holes for electrically connecting the adjacent layers of the p-type thermoelectric material layers and the n-type thermoelectric material layers.
(2) The thermoelectric conversion element described in (1), further comprising high heat-transfer films between adjacent pairs of the plurality of substrates and the p-type thermoelectric material layers.
(3) The thermoelectric conversion element described in (1), further comprising high heat-transfer films between adjacent pairs of the plurality of substrates and the n-type thermoelectric material layers.
(4) The thermoelectric conversion element described in any one of (1) to (3), wherein the plurality of substrates consist of alternate layers of a first substrate and a second substrate, the first substrate having one or more of the p-type thermoelectric material layers formed thereon, the second substrate having one or more of the n-type thermoelectric material layers formed thereon.
(5) The thermoelectric conversion element described in (4), wherein the first substrates include the p-type thermoelectric material layers which are divided into two or more individual segments formed thereon, and the second substrates include the n-type thermoelectric material layers which are divided into two or more individual segments formed thereon.

(6) The thermoelectric conversion element described in any one of (1) to (3), wherein both of the p-type thermoelectric material layers and the n-type thermoelectric material layers on the plurality of the substrates are divided into two or more individual segments, respectively.
(7) The thermoelectric conversion element described in any one of (1) to (6), wherein the conductive material includes a projection projecting from the contact hole along the direction of arrangement of the p-type thermoelectric material layers and the n-type thermoelectric material layers, the projection creating a gap between each of adjacent pairs of the p-type thermoelectric material layers and the plurality of substrates or between each of adjacent pairs of the n-type thermoelectric material layers and the plurality of substrates.

The following thermoelectric conversion element producing method is provided in order to achieve the object.
(8) A method for producing a thermoelectric conversion element, comprising:
providing a p-type thermoelectric material layer on one side of a first substrate while making a first contact hole in one end of the first substrate, the first contact hole penetrating through the first substrate;
providing an n-type thermoelectric material layer on one side of a second substrate while making a second contact hole in one end of the second substrate, the second contact hole penetrating through the second substrate; and
stacking the first substrate and the second substrate on top of each other such that the p-type thermoelectric material layer and the n-type thermoelectric material layer appear alternately with the first or second substrate interposed therebetween, and that the first contact hole and the second contact hole appear alternately on opposite ends, in a direction perpendicular to a direction of arrangement of the p-type thermoelectric material layers and the n-type thermoelectric material layers, of the substrates,
wherein adjacent pairs of the p-type thermoelectric material layer and the n-type thermoelectric material layer are electrically connected through the contact hole.
(9) The method described in (8), wherein the step of providing the p-type thermoelectric material layer and the n-type thermoelectric material layer respectively on the first substrate and the second substrate is followed by the step of making the first contact hole and the second contact hole respectively in the first substrate and the second substrate,
the method further comprises disposing a conductive material in the first contact hole and the second contact hole for electrically connecting the adjacent pairs of the p-type thermoelectric material layer and the n-type thermoelectric material layer.
(10) The method described in (8), wherein the step of making the first contact hole and the second contact hole respectively in the first substrate and the second substrate is followed by the step of providing the p-type thermoelectric material layer and the n-type thermoelectric material layer respectively on the first substrate and the second substrate;
wherein the adjacent pairs of the p-type thermoelectric material layer and the n-type thermoelectric material layer are electrically connected by the p-type thermoelectric material layer and the n-type thermoelectric material layer, the p-type thermoelectric material layer and the n-type thermoelectric material layer extending as far as to backsides of the first substrate and second substrate through wall surfaces of the first contact hole and the second contact hole.

Advantageous Effects of Invention

In the invention, the thermoelectric conversion element comprises the alternate layers of the p-type thermoelectric material layers and the n-type thermoelectric material layers, and the plurality of substrates disposed between adjacent layers of the p-type thermoelectric material layers and n-type thermoelectric material layers. Therefore, the number of pn junction pairs per unit area can be increased, and the breakage of the thermoelectric material chip can be suppressed.

In the invention, the contact holes are alternately disposed at opposite ends of the substrates in the direction perpendicular to the direction of arrangement of the p-type thermoelectric material layers and the n-type thermoelectric material layers, and the conductive material is disposed in the contact holes. The stress applied to each thermoelectric material layer is reduced, because each thermoelectric material layer and the conductive material come easily and securely into contact with each other when the substrates are stacked. Therefore, the substrate and each thermoelectric material layer can be formed thinner. Accordingly, the number of pn junction pairs per unit area can be increased.

In the thermoelectric conversion element of the invention, the plurality of substrates are disposed between adjacent layers of the p-type thermoelectric material layers and n-type thermoelectric material layers, and the contact holes are disposed alternately at opposite ends of the substrates. Therefore, productivity is enhanced in the thermoelectric conversion element of the invention compared with the case in which the p-type thermoelectric material layer and the n-type thermoelectric material layer, which are alternately stacked with the substrate interposed therebetween, are connected by the electrode formed at the edge like the conventional thermoelectric conversion element.

According to the thermoelectric conversion element of the invention, the number of pn junction pairs per unit area is increased because the p-type thermoelectric material layers and the n-type thermoelectric material layers are formed into a layered shape. Therefore, the high output can be obtained. Because the plurality of substrates are disposed between adjacent layers of the p-type thermoelectric material layers and n-type thermoelectric material layers, reliability degradation caused by the breakage of the thermoelectric material can be prevented irrespective of the thermoelectric material.

DESCRIPTION OF EMBODIMENTS

Figure 1A:
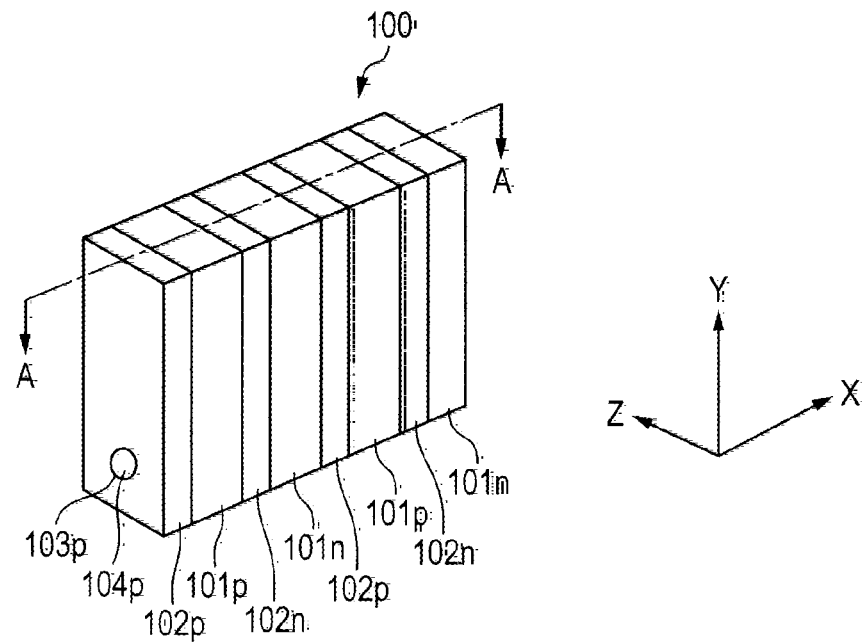
FIG. 1 is a view illustrating a schematic configuration of a thermoelectric conversion element according to Embodiment 1 of the invention.

Now, embodiments of the present invention will be described in detail with reference to the accompanying drawings. In the drawings, particularly "p" is affixed to a configuration relating to a p-type thermoelectric material layer, and "n" is affixed to a configuration relating to an n-type thermoelectric material.

Embodiment 1

Figure 1B:
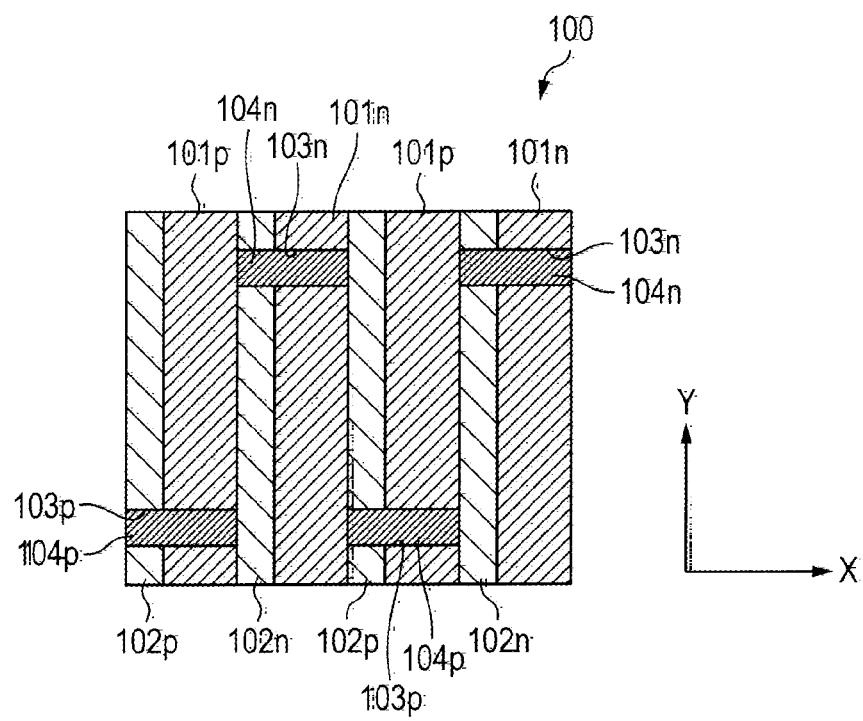

FIGS. 1A and 1B are a schematic configuration of thermoelectric conversion element 100 according to Embodiment 1 of the invention. FIG. 1A is a perspective view, and FIG. 1B is a sectional view taken on a line A-A of FIG. 1A.

As illustrated in FIG. 1, thermoelectric conversion element 100 of Embodiment 1 includes plural substrates 101 (i.e., p-substrates 101p and n-substrates 101n), and alternate layers of p-type thermoelectric material layer 102p and n-type thermoelectric material layer 102n. The plurality of substrates 101 are disposed between adjacent layers of p-type thermoelectric material layer 102p and n-type thermoelectric material layer 102n. The plurality of substrates 101 have contact holes 103 such that contact holes 103 are disposed alternately at opposite ends, in the direction perpendicular to the direction of arrangement of p-type thermoelectric material layer 102p and n-type thermoelectric material layer 102n, of substrates 101. In FIG. 1, the sign X designates the direction of arrangement of p-type thermoelectric material layer 102p and n-type thermoelectric material layer 102n. In FIG. 1, the sign Y designates the direction perpendicular to the X-direction. In FIG. 1, the sign Z designates a direction orthogonal to both the X-direction and the Y-direction.

For example, substrate 101p, that is adjacent to p-type thermoelectric material layer 102p on one side in the X-direction, includes contact hole 103p in one end portion in the Y-direction. On the other hand, substrate 101n, that is adjacent to p-type thermoelectric material layer 102p on the other side in the X-direction, includes contact hole 103n in the other end portion in the Y-direction. Conductive material 104 is disposed in contact hole 103, and conductive material 104 electrically connects the adjacent layers of p-type thermoelectric material layer 102p and n-type thermoelectric material layer 102n, which are adjacent to each other with substrate 101 interposed therebetween.

Preferably substrate 101 is formed into a film shape. Use of the thin film as substrate 101 can reduce an occupied volume of an insulating substrate in the thermoelectric conversion element, and an occupied volume of a thermoelectric material can be increased. Therefore, the number of pn junction pairs per unit area can be increased, and a higher-voltage output can be obtained.

Preferably a material having a high heat-resistant property is used as a material of substrate 101. The material of substrate 101 may be an inorganic material or a heat-resistant resin such as polyimide. The material having the high heat-resistant property is used as the material of substrate 101, which allows a temperature range to be widened to a higher temperature during production and use of the thermoelectric conversion element. For example, a polyimide film having a thickness of 1 to 100 um can be used as substrate 101. As to dimensions of substrate 101, for example, a length in the Y-direction ranges from 1 to 5 mm, and a length in the Z-direction ranges from 10 to 50 mm.

Each of p-type thermoelectric material layer 102p and n-type thermoelectric material layer 102n is a material layer in which an electromotive force is generated when a temperature difference is generated at both ends thereof. A material for the thermoelectric material layer can be selected according to the temperature difference that is generated during use of the thermoelectric conversion element. For example, a bismuth-tellurium based material (Bi—Te based material) can be used as the material when the temperature difference ranges from room temperature to 500 K, a lead-tellurium system (Pb—Te system) can be used as the material when the temperature difference ranges from room temperature to 800 K, and a silicon-germanium system (Si—Ge system) can be used as the material when the temperature difference ranges from room temperature to 1,000 K.

For example, the materials for the p-type and n-type thermoelectric material layers can be obtained by adding a proper dopant to the above material. An example of the dopant, used to obtain the material of the p-type thermoelectric material layer, may include Sb. An example of the dopant, used to obtain the material of the n-type thermoelectric material layer, may include Se. The above material forms a mixed crystal by the addition of the dopant. Accordingly, the dopant is added to the above material in an amount of such that the dopant is expressed in a composition formula of the above material such as "$Bi_{0.5}Sb_{1.5}Te_3$" and "$Bi_2Te_{2.7}Se_{0.3}$".

Preferably the Bi—Te based material that is of the material having excellent performance around room temperature is used as the thermoelectric materials for p-type thermoelectric material layer 102p and n-type thermoelectric material layer 102n.

There is no particular limitation to the thicknesses of thermoelectric material layers 102 and 103. From the viewpoint of increasing the number of pn junction pairs per unit area and obtaining the higher-voltage output, a thin thermoelectric material layer 102 is preferable. From this point of view, an example of the preferable thermoelectric material layer may include a layer having the thickness of 400 to 500 nm. On the other hand, a thick thermoelectric material layer 102 is preferable because a simpler, low-cost process can be selected in forming thermoelectric material layers 102 and 103. Such a thermoelectric material layer having a relatively large thickness can be formed by offset printing, inkjet printing, and plating.

Contact hole 103 is made in substrate 101. At least one contact hole 103 is formed in one end portion or the other end portion in the Y-direction of one p-type thermoelectric material layer 102p or one n-type thermoelectric material layer 102n. One contact hole 103 is preferably made per thermoelectric material layer from the viewpoint of simplification of the process. However, at least two contact holes 103 may be made per thermoelectric material layer, for example, from the viewpoint of stability of a contact state between the substrates stacking one another. There is no particular limitation to a diameter of contact hole 103. However, from the view point of sufficiently introducing conductive material 104 to the inside of contact hole 103, preferably the diameter of contact hole 103 is not lower than 0.8 time the thickness of substrate 101, more preferably the diameter of contact hole 103 is 1 to 10 times the thickness of substrate 101.

In the X-direction, conductive material 104 disposed in contact hole 103 is in contact with both p-type thermoelectric material layer 102p and n-type thermoelectric material layer 102n, which are adjacent to each other with substrate 101 interposed therebetween. Contact hole 103 may be filled with conductive material 104, or an inner peripheral wall of contact hole 103 may be covered with conductive material 104. There is no need to cover a whole surface of the inner peripheral wall of contact hole 103 with conductive material 104, but it is only necessary that conductive material 104 connects p-type thermoelectric material layer 102p and n-type thermoelectric material layer 102n, which are adjacent to each other with substrate 101 interposed therebetween, along an axial direction (X-direction) of contact hole 103.

For example, conductive material 104 is: a conductive paste such as an Ag paste with which contact hole 103 is filled; a metallic layer such as Cu with which the inner peripheral wall of contact hole 103 is covered; p-type or n-type thermoelectric material layer 102 or 103 which is formed from the surface of substrate 101 such that the inner peripheral wall of contact hole 103 is covered with p-type or n-type thermoelectric material layer 102 or 103; or a combination of at least two thereof.

The thermoelectric conversion element of Embodiment 1 can be produced as follows. P-type thermoelectric material layer 102p is formed on substrate 101p by, for example, sputtering. Similarly n-type thermoelectric material layer 102n is formed on substrate 101n by the sputtering.

For example, polyimide having the thickness of 50 um is used as substrate 101. On substrate 101, for example, a layer made of $(Bi_2Te_3)_{0.25}(Sb_2Te_3)_{0.75}$ having the thickness of about 25 to about 30 um is formed as p-type thermoelectric material layer 102p by the sputtering, and a layer made of $Bi_2Te_{2.7}Se_{0.3}$ having the thickness of about 25 to about 30 um is formed as n-type thermoelectric material layer 102n by the sputtering. A target that is prepared by mechanical alloying and pulsed electric current sintering can be used as a target for each thermoelectric material (for example, see NPL 2). In forming p-type and n-type thermoelectric material layers 102p and 102n, an RF sputtering apparatus is used, and Ar is used as a sputtering gas. As to sputtering conditions, for example, an output is 40 W, and an Ar gas pressure is in the range from $1\times10^{-1}$ to $1.5\times10^{-1}$ Pa.

After the sputtering, substrate 101 including p-type and n-type thermoelectric material layers 102p and 102n may be heated in air, in vacuum, or in an inert gas such as a nitrogen gas. Through the heating, p-type and n-type thermoelectric element layers 102p and 102n are stabilized, and electric resistances of p-type and n-type thermoelectric element layers 102p and 102n are decreased. Therefore, performance of p-type and n-type thermoelectric element layers 102p and 102n can be improved.

Then, contact hole 103p is made in an end portion of substrate 101p, and contact hole 103n is made in an end portion of substrate 101n. For example, contact hole 103 is made by a usual perforation method such as processing by a laser and a drill, punching, and etching.

Then, conductive material 104 is disposed in contact hole 103. For example, contact hole 103 is filled with the conductive paste, or contact hole 103 is plated with metal, which allows conductive material 104 to be disposed in contact hole 103.

Then, substrates 101p and substrates 101n are alternately disposed, and therefore p-type thermoelectric material layers 102p and n-type thermoelectric material layers 102n are alternately disposed with substrate 101 interposed therebetween. At this point, when contact hole 103p is disposed in one end portion in the Y-direction of substrate 101p, contact hole 103n is disposed in the other end portion in the Y-direction of substrate 101n.

Along the X-direction, contact holes 103 made in substrates 101 are alternately disposed at one end portion and the other end portion in the Y-direction by the stacking. As a result, p-type thermoelectric material layer 102p and n-type thermoelectric material layer 102n, which are adjacent to each other with substrate 101 interposed therebetween, are electrically connected in series.

Preferably a disposed structure described above is integrated in the thermoelectric conversion element. The disposed structure can be integrated such that an adhesive tape adheres to an end face in the Y-direction over the whole region in the X-direction. Alternatively, the disposed structure can be integrated such that disposed substrates 101 are bounded by a frame body. Alternatively, the disposed structure can be integrated such that p-type thermoelectric material layer 102p, n-type thermoelectric material layer 102n, and substrate 101, which are in contact with one another, are bonded to one another by a bonding agent.

The thermoelectric conversion element is disposed such that the Y-direction of the thermoelectric conversion element is matched with a heat flow direction, which allows the thermoelectric conversion element to be used in power generation by the temperature difference. The thermoelectric conversion element can be used as a temperature control device by passage of a current.

The thermoelectric conversion element has the disposed structure in which p-type thermoelectric material layers 102p and n-type thermoelectric material layers 102n are alternately disposed with substrate 101 interposed therebetween. Therefore, the number of pn junction pairs per unit area can be increased, and the breakage of the thermoelectric material chip is hardly generated.

In the thermoelectric conversion element, p-type thermoelectric material layer 102p and n-type thermoelectric material layers 102n are electrically connected in series by conductive material 104 disposed in contact hole 103. The thickness of conductive material 104 is easily controlled because conductive material 104 is disposed in contact hole 103. Therefore, when substrates 101 are disposed, each thermoelectric material layer 102 and conductive material 104 are easily and securely in contact with each other. Therefore, because a stress applied to each thermoelectric material layer is reduced when substrates 101 are disposed, substrate 101 and each thermoelectric material layer 102 can be formed thinner. From this viewpoint, the number of pn junction pairs per unit area can be increased in the thermoelectric conversion element.

In the thermoelectric conversion element, an electrically-conducting path is formed in the end portion in the Y-direction of substrate 101 by conductive material 104 disposed in contact hole 103. Different material layers are electrically connected in series by alternately stacking substrates 101 having the different material layers. Therefore, the thermoelectric conversion element can more easily be prepared compared with the conventional thermoelectric conversion element in which the electrodes are formed in the end faces of the stacking object of thermoelectric material layer and the substrate. Accordingly, high productivity is implemented.

The thermoelectric conversion element includes contact hole 103p that is made at one end portion in the Y-direction of substrate 101p and contact hole 103n that is made at the other end portion in the Y-direction of substrate 101n. Therefore, the thermoelectric conversion element can obtain the high output because the temperature difference between contact hole 103p and contact hole 103n is ensured.

In the thermoelectric conversion element, the thermoelectric material layer is formed by the sputtering. The sputtering film is a thin film, and crystal grains of the thermoelectric conversion material constituting the sputtering film become fine. Therefore, in the thermoelectric conversion element, the number of pn junction pairs per unit area can be increased, and the higher output can be obtained.

Embodiment 2

Figure 2A:
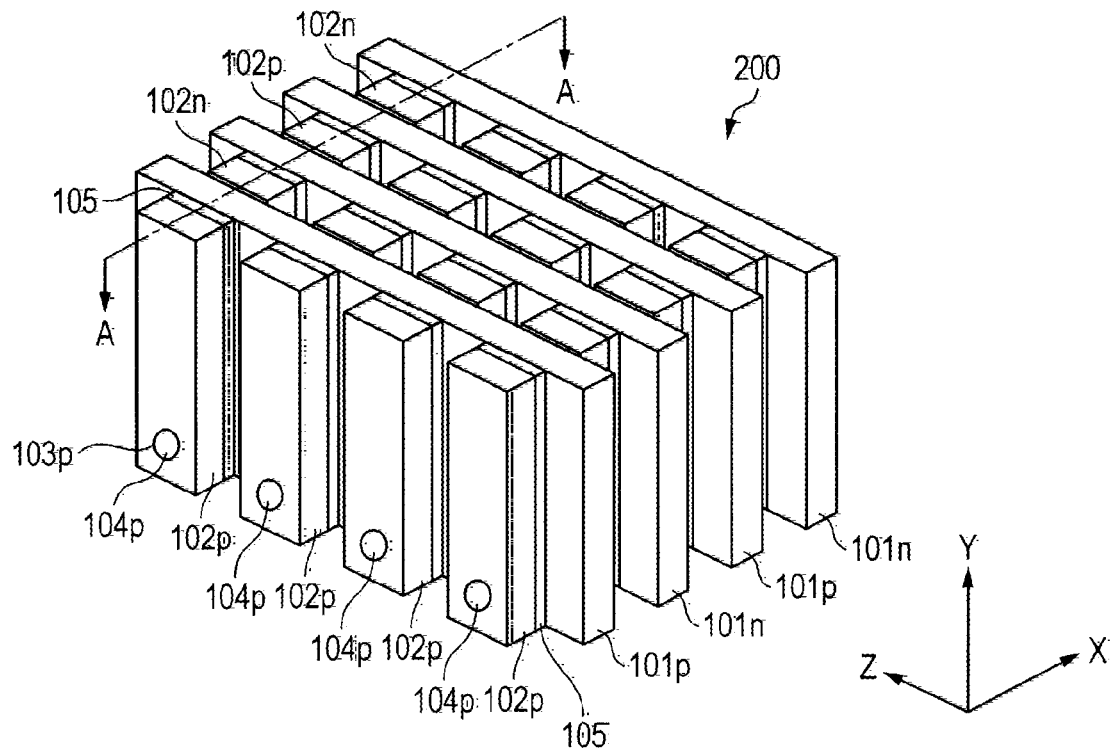
FIG. 2 is a view illustrating a schematic configuration of a thermoelectric conversion element according to Embodiment 2 of the invention.
Figure 2B:
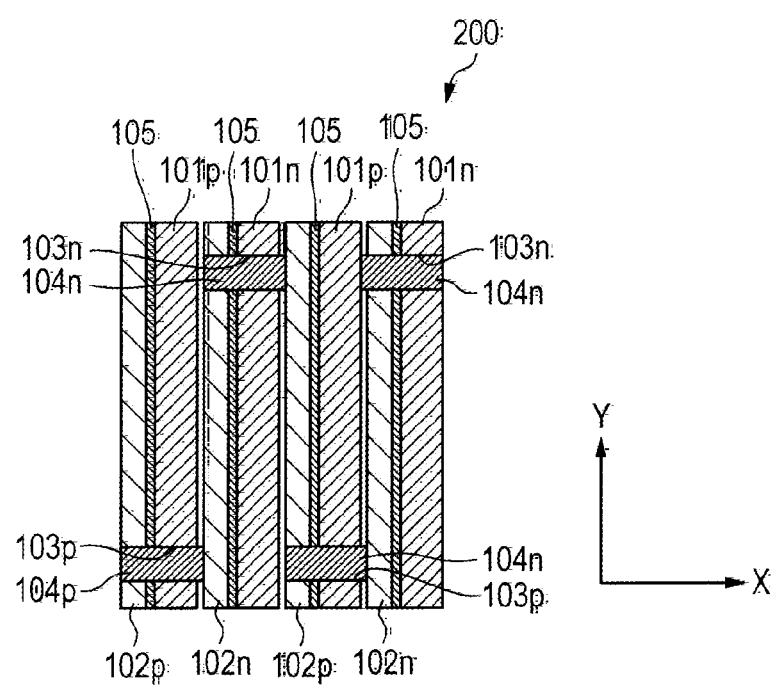

FIGS. 2A and 2B illustrate a schematic configuration of thermoelectric conversion element 200 according to Embodiment 2 of the invention. FIG. 2A is a perspective view, and FIG. 2B is a sectional view taken on a line A-A of FIG. 2A.

As illustrated in FIGS. 2A and 2B, plural substrates 101p and plural substrates 101n are alternately disposed in thermoelectric conversion element 200 of Embodiment 2. P-type thermoelectric material layer 102p is formed in the surface of each of substrates 101p, and n-type thermoelectric material layer 102n is formed in the surface of each of substrates 101n. Plural segments of p-type thermoelectric material layer 102p are formed in one substrate 101p. Plural segments of n-type thermoelectric material layer 102n are formed in one substrate 101n. As illustrated in FIG. 2A, p-type thermoelectric material layers 102p and n-type thermoelectric material layers 102n are respectively arrayed in the Z-direction on each substrate 101. Each segments of p-type thermoelectric material layer 102p and each n-type thermoelectric material layer 102n are formed into a strip, rectangular shape in the Y-direction, respectively. As to dimensions of each rectangular thermoelectric material layer 102, for example, the length in the Y-direction ranges from 1 to 5 mm, and the length in the Z-direction ranges from 0.05 to 2 mm.

High heat-transfer films 105 having high thermal conductivity (for example, 50 W/{(m)×(K)} or more) are formed between substrate 101p and p-type thermoelectric material layer 102p and between substrate 101n and n-type thermoelectric material layer 102n, respectively. High heat-transfer film 105 may be formed in a whole of one of surfaces of substrate 101, or high heat-transfer film 105 may be plural strip rectangular films in the Y-direction, which are arrayed in the Z-direction similarly to the thermoelectric material layer as illustrated in FIG. 2A. For example, a thin film or thick film, which is made of Ag (silver), Au (gold), Pd (palladium), Pt (platinum), or W (tungsten), can be used as high heat-transfer film 105. The thickness of the thin film is, for example, 200 nm.

As illustrated in FIG. 2B, each segments of p-type thermoelectric material layer 102p and each segments of n-type thermoelectric material layer 102n are electrically connected by conductive material 104p disposed in contact hole 103p. Each segments of p-type thermoelectric material layer 102p and each segments of n-type thermoelectric material layer 102n are adjacent to each other with substrate 101, for example, substrate 101p, interposed therebetween. Contact hole 103p of substrate 101p is formed at one end portions in a lengthwise direction (Y-direction). Contact hole 103n of substrate 101n is formed at the other end portion in the lengthwise direction (Y-direction).

Contact hole 103 is filled with conductive material 104. As illustrated in FIG. 2B, conductive material 104 is projected from an end on one side (side of substrate 101) in the X-direction of contact hole 103. Therefore, a gap exists between substrate 101 and p-type thermoelectric material layer 102p or n-type thermoelectric material layer 102n, which exists on one side in the X-direction.

An example of a method for producing thermoelectric conversion element 200 of Embodiment 2 will be described below with reference to FIGS. 3A to 3D.

A metal mask (not illustrated) is placed over polyimide substrate 101, and high heat-transfer film 105 is formed into a predetermined shape on substrate 101 by, for example, the sputtering.

While the metal mask is placed, each of segments of p-type thermoelectric material layer 102p or each of segments of n-type thermoelectric material layer 102n is formed into the predetermined shape on high heat-transfer film 105 by the sputtering. In Embodiment 2, high heat-transfer film 105 and p-type thermoelectric material layer 102p or n-type thermoelectric material layer 102n are formed by the sputtering. Alternatively, high heat-transfer film 105 and p-type thermoelectric material layer 102p or n-type thermoelectric material layer 102n may be formed by an evaporation method or a plasma CVD method.

High heat-transfer film 105, p-type thermoelectric material layer 102p, and n-type thermoelectric material layer 102n are formed into the predetermined shape divided the surface shape of substrate 101 into plural segments by placing the metal mask over the substrate, respectively. Alternatively, after high heat-transfer film 105, p-type thermoelectric material layer 102p, and n-type thermoelectric material layer 102n are formed over the substantially whole surface of substrate 101, high heat-transfer film 105, p-type thermoelectric material layer 102p, and n-type thermoelectric material layer 102n may partially be removed to divide into plural segments by laser irradiation, cutting, etching, and the like.

SUS 304 can be used as a material for the metal mask. However, the material is not limited to SUS 304. In consideration of a heat-resistant property and workability, the material for the metal mask may be selected according to an intended deposit condition or shape.

Then, contact hole 103 is made in substrate 101 on which thermoelectric material layer 102 is formed. A hole is pierced through substrate 101 by the method such as the processing by the laser and the drill, the punching, and the etching, thereby making contact hole 103. The hole may be made by overlapping plural substrates 101 and piercing through all of the overlapped substances 101, when the dispositions and shapes of p-type thermoelectric material layers 102p and n-type thermoelectric material layers 102n in each substrate 101 are symmetrical in each of the Y-direction and the Z-direction.

Figure 3A:
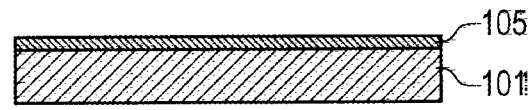
FIG. 3 is a view illustrating a method for producing the thermoelectric conversion element according to Embodiment 2 of the invention.
Figure 3B:
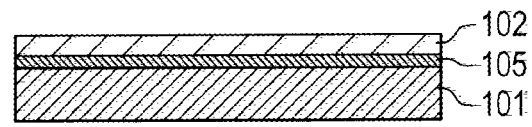
Figure 3C:
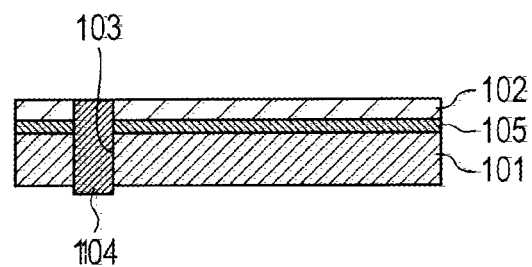
Figure 3D:
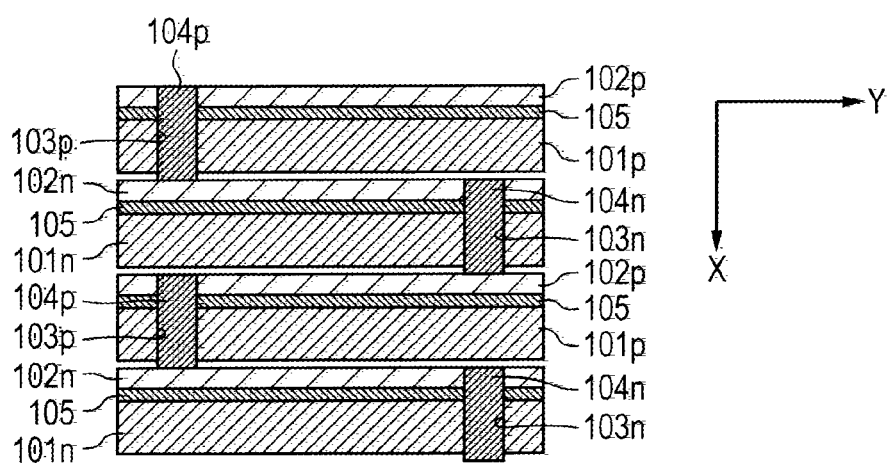

Then, conductive material 104 is disposed in contact hole 103. For example, contact hole 103 is filled with the conductive paste such as the Ag paste, thereby disposing conductive material 104 in contact hole 103. As illustrated in FIG. 3C, an end of conductive material 104 on the side of the thermoelectric material layer is formed so as to be flush with the surface of contact hole 103. A projection is projected from contact hole 103 at an end of the conductive material 104 on the side of substrate 101. For example, a projected length of the projection ranges from 0.01 to 1 um.

For example, while or after contact hole 103 is filled with the conductive paste, a plate, having a hole whose diameter is substantially identical to that of contact hole 103 and a desired thickness, is overlapped with substrate 101 to surround contact hole 103 by the plate, and the excess paste is removed along the surface of the plate, and the plate is taken off from substrate 101, which allows the projection to be formed.

Then, substrates 101p and substrates 101n are alternately disposed. Segments of p-type thermoelectric material layer 102p are formed in the surface of each of substrates 101p, and segments of n-type thermoelectric material layer 102n are formed in the surface of each of substrates 101n. At this point, contact hole 103p of substrate 101p is disposed at one end portion in the Y-direction. Contact hole 103n of substrate 101n is disposed at the other end portion in the Y-direction.

Each of segments of thermoelectric material layer 102p and each of segments of n-type thermoelectric material layer 102n are electrically connected in series along the X-direction with conductive material 104 interposed therebetween by stacking substrates 101. Segments of p-type thermoelectric material layer 102p on one substrate 101p and segments of n-type thermoelectric material layer 102n on one substrate 101n are arrayed in the Z-direction, respectively. All of the disposed segments of thermoelectric material layer 102p and 102n constituting the disposed groups in the X-direction are electrically connected in series by conductive materials 104 disposed in contact holes 103.

Similarly to the thermoelectric conversion element of Embodiment 1, each thermoelectric material layer and the substrate are integrated by the adhesion of the adhesive tape to the end face in the Y-direction, the binding by the frame body, or the bonding of the projection and the thermoelectric material layer by the bonding agent, thereby forming the thermoelectric conversion element. The thermoelectric conversion element is disposed such that the Y-direction of the thermoelectric conversion element is matched with a heat flow direction, which allows the thermoelectric conversion element to be used in the power generation by the temperature difference. The thermoelectric conversion element can be used as the temperature control device by the passage of the current.

The thermoelectric conversion element of Embodiment 2 has the same effect as that of Embodiment 1 in the same configuration as that of Embodiment 1.

Preferably only p-type thermoelectric material layer 102p is formed in substrate 101p, and only n-type thermoelectric material layer 102n is formed in substrate 101n. All the thermoelectric material layers are formed on one substrate 101 only by the p-type thermoelectric material layers or the n-type thermoelectric material layers. Therefore, the number of processes can be decreased in manufacturing the thermoelectric material compared with the case in which both the p-type and n-type thermoelectric material layers are formed on one substrate 101.

In the thermoelectric conversion element, plural segments of p-type thermoelectric material layer 102p are formed on one substrate 101p, and plural segments of n-type thermoelectric material layers 102n are formed on one substrate 101n. Therefore, the number of pn junction pairs per unit area can further be increased, and the higher output can be obtained.

In the thermoelectric conversion element, conductive material 104 includes the projection projected from contact hole 103. Therefore, the gap is formed between thermoelectric material layer 102 and substrate 101. The existence of the gap can reduce the thermal conductivity between a high-temperature end and a low-temperature end of thermoelectric material layer 102 during the use of thermoelectric conversion element 200, and the higher output can be obtained.

The thermoelectric conversion element also includes high heat-transfer film 105 that is provided between thermoelectric material layer 102 and substrate 101. During the deposition of thermoelectric material layer 102, the provided high heat-transfer film 105 promotes a crystal orientation of the thermoelectric material of thermoelectric material layer 102. During the deposition of thermoelectric material layer 102, the thermoelectric material is rapidly quenched on high heat-transfer film 105, whereby a crystal grain of the thermoelectric material becomes finer. Therefore, the thermoelectric performance of the thermoelectric material layer 102 is further improved, and the higher output can be obtained.

In Embodiment 2, the Bi—Te based material is used as thermoelectric material layer 102. There is no particular limitation to the material for thermoelectric material layer 102, but the material may arbitrarily be changed according to a usage environment or an intended use of thermoelectric conversion element 200.

In Embodiment 2, contact hole 103 is made after thermoelectric material layer 102 is deposited on substrate 101. Alternatively, in the invention, contact hole 103 may be made in substrate 101 before thermoelectric material layer 102 is deposited. In this case, the electric conduction of contact hole 103 can simultaneously be established with formation of high heat-transfer film 105 and thermoelectric material layer 102 performed after perforation of contact hole 103.

A method for establishing the electric connection will be described below by taking a embodiment, in which the thermoelectric material layer is directly formed on substrate 101, as an example.

Figure 4A:
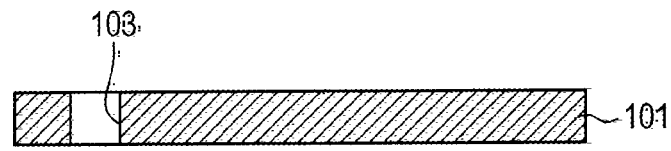
FIG. 4 is a view illustrating another method for producing the thermoelectric conversion element according to Embodiment 2 of the invention.
Figure 4B:
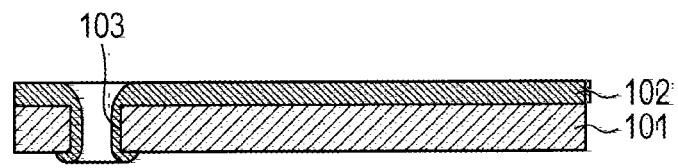
Figure 4C:
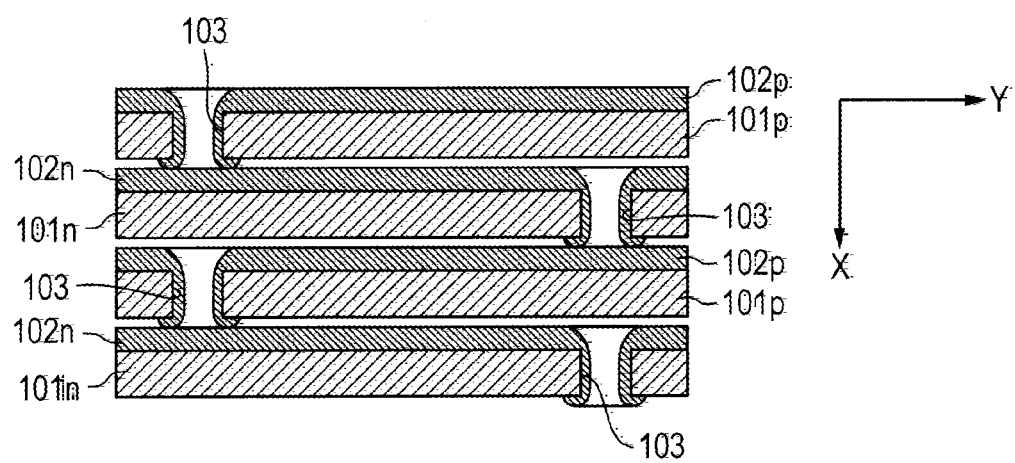

As illustrated in FIGS. 4A to 4C, contact hole 103 is made in substrate 101 (FIG. 4A). Then thermoelectric material layer 102 is deposited by the sputtering. The thermoelectric material goes partially round to the back side of substrate 101 while adhering to the inner wall of contact hole 103. Therefore, the thermoelectric material adheres to an opening edge (on the side of substrate 101 in the X-direction) of contact hole 103 (FIG. 4B). The thermoelectric material adhering to the opening edge forms the projection. That is, the thermoelectric material, that adheres to the inside of contact hole 103 and that forms the projection, constitutes the conductive material.

When substrates 101 including the thermoelectric material layers are disposed, the projection of the thermoelectric material is in contact with each thermoelectric material layer as illustrated in FIG. 4C. Along the X-direction, the projections are alternately disposed in one end portion and the other end portion in the Y-direction. From the viewpoint of simplifying the process, the projection is more effectively made of the thermoelectric material.

In the method illustrated in FIGS. 4A to 4C, the thermoelectric material layer may be deposited after contact hole 103 is made in substrate 101 including the high heat-transfer film 105. According to the method, the thermoelectric conversion element, which includes high heat-transfer film 105 while the thermoelectric material is used as the conductive material, can be produced.

Conductive material 104 may further be disposed in contact hole 103 in which the thermoelectric material is disposed. In this case, the thermoelectric material also acts as an underlying layer of conductive material 104. Therefore, effectively conductive material 104 is more strongly disposed in contact hole 103.

The material for high heat-transfer film 105 is used instead of the thermoelectric material, and high heat-transfer film 105 is formed in substrate 101 in which contact hole 103 is made, which allows the material for high heat-transfer film 105 to be used as the conductive material similarly to the thermoelectric material in the above method.

Embodiment 3

In the thermoelectric conversion element of the invention, the p-type thermoelectric material layers and the n-type thermoelectric material layers are alternately disposed along the X-direction, the disposition of the contact hole may vary in the Y-direction, and the disposition of the thermoelectric material layer may vary in the Z-direction on the same substrate.

Figure 5:
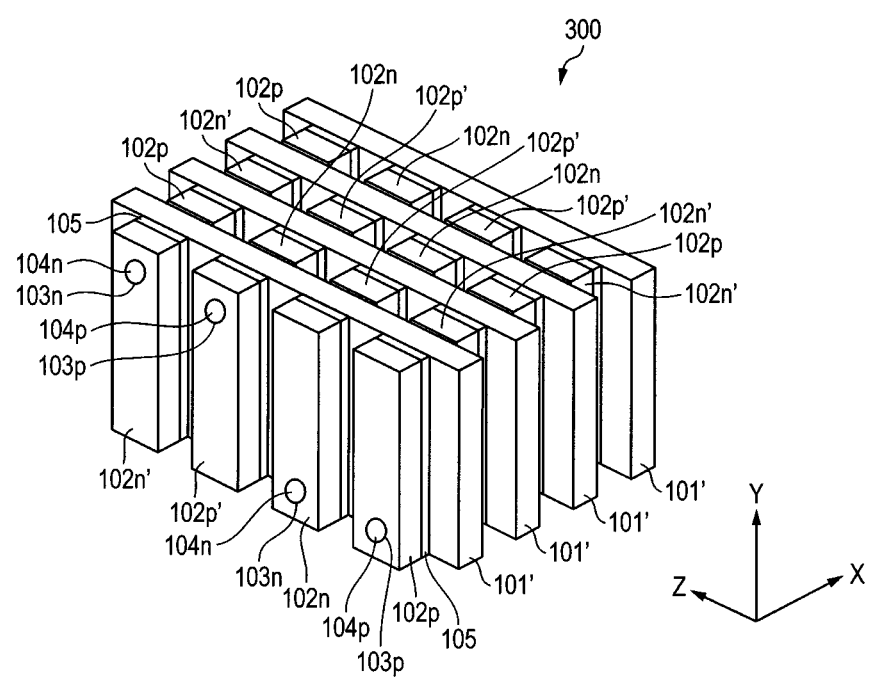
FIG. 5 is a view illustrating a schematic configuration of a thermoelectric conversion element according to Embodiment 3 of the invention.

For example, in thermoelectric conversion element 300 illustrated in FIG. 5, p-type thermoelectric material layers 102*p* and n-type thermoelectric material layers 102*n* are alternately arrayed along the X-direction. On one substrate 101', segments of p-type thermoelectric material layers 102*p* and segments of n-type thermoelectric material layers 102*n* are alternately disposed along the Z-direction, respectively. For example: a segment of p-type thermoelectric material layer 102*p* that includes contact hole 103*p* on one end side in the Y-direction; a segment of n-type thermoelectric material layer 102*n* that includes contact hole 103*n* on one end side; a segment of p-type thermoelectric material layer 102*p*' that includes contact hole 103*p* on the other end side; and a segment of n-type thermoelectric material layer 102*n*' that includes contact hole 103*n* on the other end side; are disposed along the Z-direction on one substrate 101'. Thus, the positions in the Y-direction of contact holes 103 of the thermoelectric material layers vary on one substrate 101'. Along the X-direction, contact holes 103 are alternately disposed in one end portion and the other end portion in the Y-direction.

Thermoelectric conversion element 300 can be produced by the method of FIGS. 3A to 3D except that segments of p-type thermoelectric material layers 102*p* and segments of n-type thermoelectric material layers 102*n* are alternately disposed along the Z-direction on substrate 101' and that contact hole 103 is located in one end portion or the other end portion in the Y-direction according to a type of each thermoelectric material layer. Thermoelectric conversion element 300 of Embodiment 3 has the same effect as that of Embodiments 1 and 2 in the same configuration as that of Embodiments 1 and 2.

In the thermoelectric conversion element of the invention, the contact holes may alternately be disposed in one end portion and the other end portion in the Y-direction along the X-direction, and there is no need to form all the contact holes in one end portion in one substrate 101.

In addition to the embodiment of FIG. 5, for example, on the same substrate, all contact holes 103*p* corresponding to p-type thermoelectric material layers 102*p* may be made in one end portion in the Y-direction of substrate 101 while all contact holes 103*n* corresponding to n-type thermoelectric material layers 102*n* are made in the other end portion in the Y-direction of substrate 101.

Embodiment 4

Figure 6A:
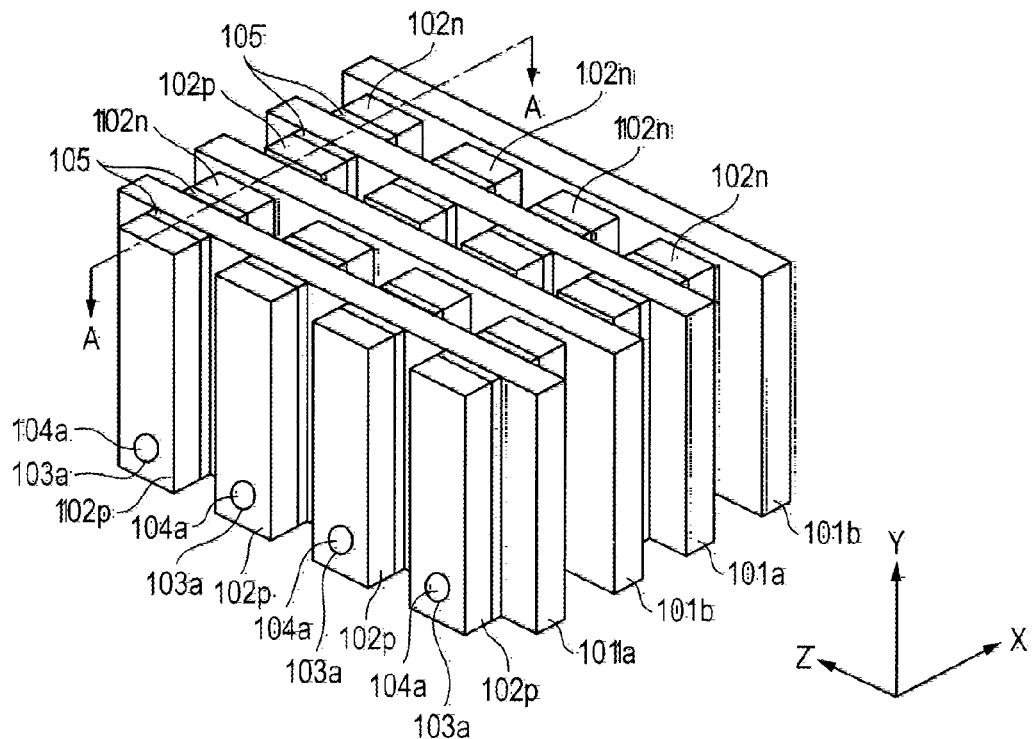
FIG. 6 is a view illustrating a schematic configuration of a thermoelectric conversion element according to Embodiment 4 of the invention.
Figure 6B:
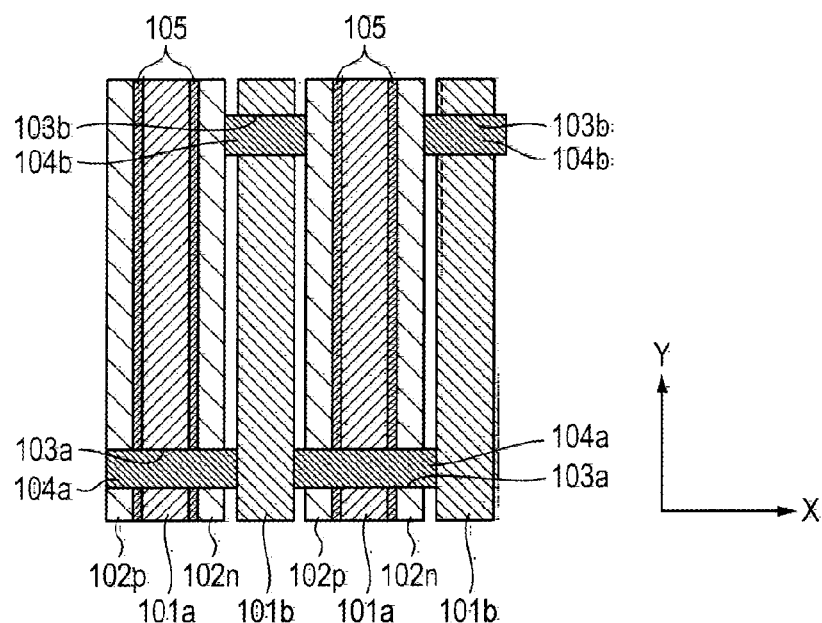

FIGS. 6A and 6B illustrate a schematic configuration of a thermoelectric conversion element according to Embodiment 4 of the invention. FIG. 6A is a perspective view, and FIG. 6B is a sectional view taken on a line A-A of FIG. 6A.

As illustrated in FIGS. 6A and 6B, plural substrates 101*a* in each of which p-type thermoelectric material layer 102*p* and n-type thermoelectric material layer 102*a* are formed in the surface thereof and plural substrates 101*b* in each of which the thermoelectric material layer 102 is not formed are alternately disposed in thermoelectric conversion element 400 of Embodiment 4. P-type thermoelectric material layer 102*p* is formed in one of two surfaces of substrate 101*a*, and n-type thermoelectric material layer 102*n* is formed in the other surface of substrate 101*a*.

In each thermoelectric material layer, similarly to Embodiment 2, the plural strip, rectangular layers in the Y-direction are arrayed along the Z-direction. High heat-transfer films 105 are formed between substrate 101*a* and p-type thermoelectric material layer 102*p* and between substrate 101*a* and n-type thermoelectric material layer 102*n*, respectively.

Contact hole 103*a* that pierces through p-type thermoelectric material layer 102*p*, n-type thermoelectric material layer 102*n*, and substrate 101*a* is made in one end portion in the Y-direction of substrate 101*a*. Contact hole 103*b* that pierces through substrate 101*b* is made in the other end portion in the Y-direction of substrate 101*b*.

Conductive material 104*a* is disposed in contact hole 103*a*. Conductive material 104*a* includes the projection only at one end on the side of n-type thermoelectric material layer 102*n*. The projection is in contact with the surface of substrate 101*b*.

Conductive material 104*b* is disposed in contact hole 103*b*. Conductive material 104*b* includes the projections that are projected from the surfaces of substrate 101*b* at both ends in the X-direction. The projection is in contact with p-type thermoelectric material layer 102*p* at one end in the X-direction, and is in contact with n-type thermoelectric material layer 102*n* at the other end in the X-direction.

The gaps each having an interval which is the same length as the projected length of the projection are formed between substrate 101*b* and p-type thermoelectric material layer 102*p* and between substrate 101*b* and n-type thermoelectric material layer 102*n*, respectively. The projection of conductive material 104*a* in contact hole 103*a* acts as a spacer. The projection of conductive material 104*b* in contact hole 103*b* acts as the spacer and an electric contact of p-type thermoelectric material layer 102*p* and n-type thermoelectric material layer 102*n*, between which substrate 101*b* is sandwiched in the X-direction.

A method for producing thermoelectric conversion element 400 of Embodiment 4 will be described below with reference to FIGS. 7A to 7D.

Figure 7A:
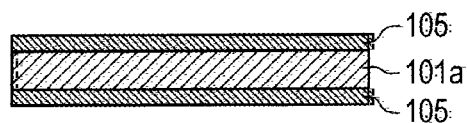
FIG. 7 is a view illustrating a method for producing the thermoelectric conversion element according to Embodiment 4 of the invention.

A metal mask (not illustrated) is placed over polyimide substrate 101*a*, and segments of high heat-transfer film 105 are formed into a predetermined shape on both surfaces of substrate 101*a* by the sputtering, respectively (FIG. 7A).

Figure 7B:
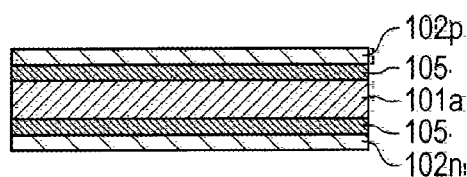

Segments of P-type thermoelectric material 102*p* are formed on high heat-transfer film 105, which is formed on one of two surfaces of substrate 101*a*, into the substantially same shape as high heat-transfer film 105 by the sputtering, and segments of n-type thermoelectric material 102*n* are formed on high heat-transfer film 105, which is formed on the other surface of substrate 101*a*, into the substantially same shape as high heat-transfer film 105 by the sputtering, respectively (FIG. 7B).

Figure 7C:
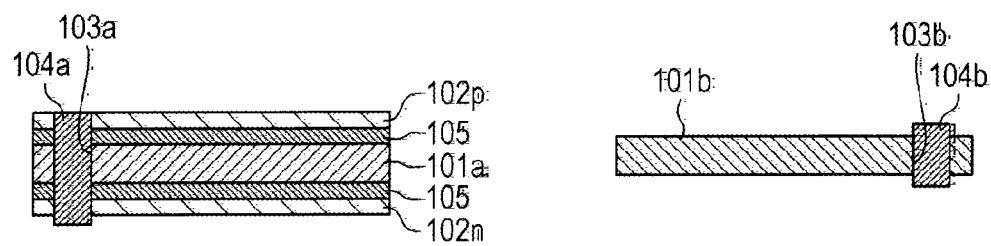

Then, contact hole 103*a* is made in an end portion of substrate 101*a*. On the other hand, substrate 101*b* is prepared, and contact hole 103*b* is made in an end portion of substrate 101*b*. Holes are made in substrates 101*a* and 101*b* by the method such as the processing by the laser and the drill, the punching, and the etching, thereby making contact holes 103*a* and 103*b*. Conductive material 104*a* that includes the projection at one end in the X-direction is disposed in contact hole 103*a*. Conductive material 104*b* that includes the projections at both ends in the X-direction is disposed in contact hole 103*b* (FIG. 7C).

For example, conductive material 104*a* is formed by the following method. Contact hole 103*a* is sufficiently filled with the conductive paste. The end face on the side of p-type thermoelectric material layer 102*p* is formed so as to be flush with the surface of p-type thermoelectric material layer 102*p*. The end face on the side of n-type thermoelectric material layer 102*n* is formed so as to be projected from the surface of n-type thermoelectric material layer 102*n* by a desired length. Therefore, conductive material 103*a* that includes the projection at the end on the side of n-type thermoelectric material layer 102*n* is formed.

Similarly, conductive material 104b is formed by the following method. Contact hole 103b is sufficiently filled with the conductive paste. Both ends of the conductive paste with which the contact hole 103b is filled are formed so as to be projected from the surfaces of substrate 101b by desired lengths. Therefore, conductive material 104b that includes the projections in both surfaces of substrate 101b is formed.

Figure 7D:
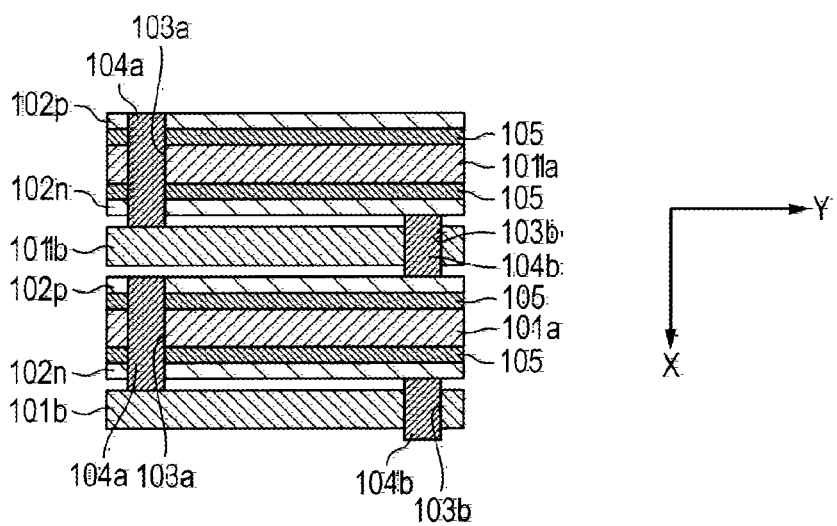
Figure 8:
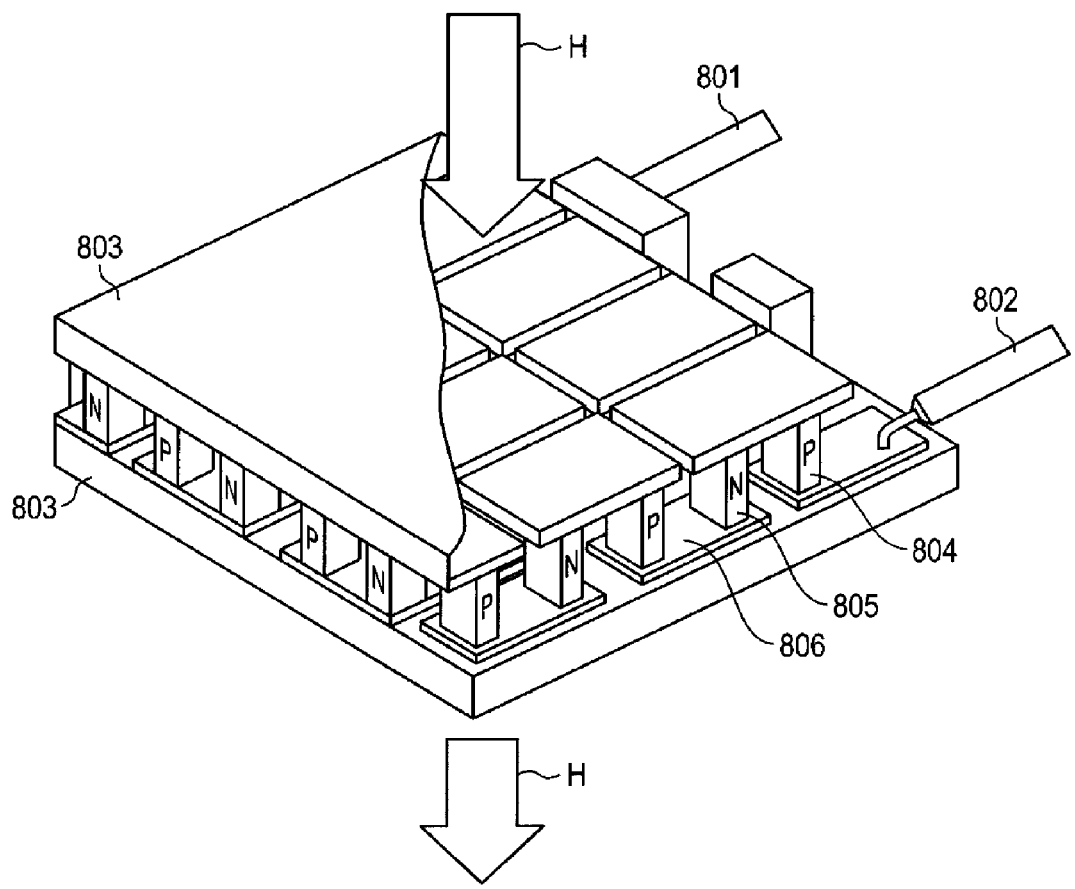
FIG. 8 is a perspective view of a conventional thermoelectric conversion element described in PTL 1.
Figure 9A:
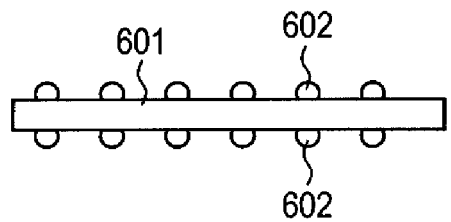
FIG. 9 is a view illustrating a method for producing a conventional thermoelectric conversion element described in PTL 2.
Figure 9B:
Figure 9C:
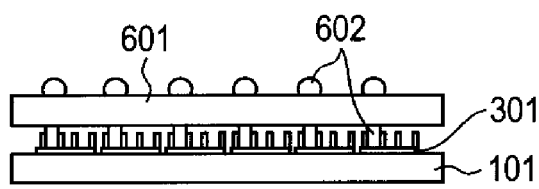
Figure 9D:
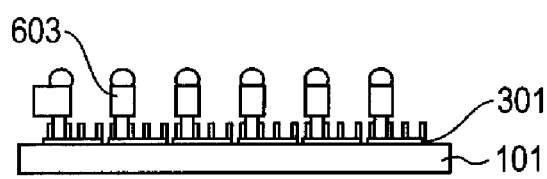
Figure 9E:
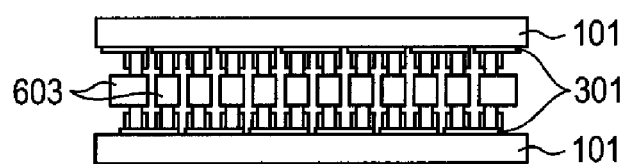

Then substrates 101a in each of which thermoelectric material 102 is formed and substrates 101b in each of which thermoelectric material 102 is not formed are alternately disposed in the X-direction (FIG. 7D). In this case, substrates 101a and substrates 101b are alternately disposed such that contact hole 103a of substrate 101a is disposed on one end side in the Y-direction, and such that contact hole 103b of substrate 101b is disposed on the other end side in the Y-direction. Therefore, p-type thermoelectric material layers 102p and n-type thermoelectric material layers 102n are alternately disposed with substrate 101a or substrate 101b interposed therebetween. Each of segments of P-type thermoelectric material layer 102p and each of segments of n-type thermoelectric material layer 102n are electrically connected in the X-direction, and are alternately connected at one end portion and the other end portion in the Y-direction. The gaps are formed between p-type thermoelectric conversion element 102p and substrate 101b and between n-type thermoelectric material layer 102n and substrate 101b by the projections of conductive materials 104a and 104b.

The thermoelectric conversion element of Embodiment 4 has the same effect as that of Embodiments 1 to 3 in the same configuration as that of Embodiments 1 to 3. In the thermoelectric conversion element of Embodiment 4: substrate 101a; p-type thermoelectric material layer 102p; n-type thermoelectric material layer 102n; and conductive material 104a that electrically connects the thermoelectric material layers; are integrally formed. Therefore, compared with Embodiment 2, Embodiment 4 is more effective from the viewpoint of enhancing reliability of the electric connection.

In the thermoelectric conversion element of Embodiment 4, conductive material 104a includes the projection at one end in the X-direction, and the projection is in contact with substrate 101b. Therefore, on one side in the X-direction, the gap between substrate 101a and substrate 101b is retained by the two projections. Accordingly, from the viewpoint of maintaining the disposed state having the gap, Embodiment 4 is more effective compared with an embodiment in which the gap is retained by the one projection.

This application is based on and claims the benefit of priority from the Japanese Patent Application No. 2011-035648, filed on Feb. 22, 2011, the entire contents of which are incorporated herein by reference.

INDUSTRIAL APPLICABILITY

In the thermoelectric conversion element of the invention and the producing method thereof, the number of thermoelectric material chip pairs per unit area can be increased, and the chip is hardly broken.

REFERENCE SIGNS LIST 100, 200, 300, 400 Thermoelectric conversion element
101, 101', 101p, 101n, 101a, 101b, 803 Substrate
102p, 102p' P-type thermoelectric material layer
102n, 102n' N-type thermoelectric material layer
103a, 103b, 103p, 103n Contact hole
104a, 104b, 104p, 104n Conductive material
105 High heat-transfer film
301 Electrode wiring
601 Thermoelectric material wafer
602 Solder bump
603 Thermoelectric material chip
801 Current introduction terminal (positive electrode)
802 Current introduction terminal (negative electrode)
804 P-type thermoelectric material
805 N-type thermoelectric material
806 Junction electrode
H Arrow indicating heat flow direction

The invention claimed is:

1. A thermoelectric conversion element comprising:
   first substrates having p-type thermoelectric material layers formed on p-substrates;
   second substrates having n-type thermoelectric material layers formed on n-substrates; and
   conductive materials connecting adjacent layers of the p-type thermoelectric material layers and the n-type thermoelectric material layers;
   wherein the first substrates and the second substrates are alternately disposed such that the p-substrates and the n-substrates are disposed between adjacent layers of the p-type thermoelectric material layers and n-type thermoelectric material layers;
   the p-substrates and the n-substrates have contact holes respectively provided in the p-substrates and the n-substrates such that the contact holes appear at ends of the p-substrate and n-substrate, in a direction perpendicular to a direction of arrangement of the p-type thermoelectric material layers and the n-type thermoelectric material layers; and
   the conductive materials are disposed in the contact holes and penetrate through the p-type thermoelectric layers or the n-type thermoelectric material layers.

2. The thermoelectric conversion element according to claim 1, further comprising high heat-transfer films between adjacent pairs of the p-substrates and the p-type thermoelectric material layers.

3. The thermoelectric conversion element according to claim 1, further comprising high heat-transfer films between adjacent pairs of the n-substrates and the n-type thermoelectric material layers.

4. The thermoelectric conversion element according to claim 1, wherein
   the p-type thermoelectric material layers are divided into two or more individual segments formed on the p-substrates, and
   the n-type thermoelectric material layers are divided into two or more individual segments formed on the n-substrates.

5. The thermoelectric conversion element according to claim 1, wherein both of the p-type thermoelectric material layers and the n-type thermoelectric material layers on the p-substrates and the n-substrates are divided into two or more individual segments, respectively.

6. The thermoelectric conversion element according to claim 1, wherein:
   each of the conductive materials includes a projection projecting from the contact holes along the direction of arrangement of the p-type thermoelectric material layers and the n-type thermoelectric material layers; and
   the projection creates a gap between adjacent pairs of the p-type thermoelectric material layers and the n-substrates or a gap between adjacent pairs of the n-type thermoelectric material layers and the p-substrates.

7. The thermoelectric conversion element according to claim 1, wherein:

the p-type thermoelectric material layers and the n-type thermoelectric material layers are extending as far as to backsides of the first substrates and the second substrates through first contact holes and second contact holes respectively, and adjacent pairs of the p-type thermoelectric material layers and the n-type thermoelectric material layers are electrically connected.

8. The thermoelectric conversion element according to claim 1, wherein the contact holes appear alternately at opposite ends of the p-substrate and n-substrate.

* * * * *